(12) United States Patent
Hirate et al.

(10) Patent No.: US 11,897,773 B2
(45) Date of Patent: Feb. 13, 2024

(54) CARBIDE-COATED CARBON MATERIAL (71) Applicant: SHIN-ETSU CHEMICAL CO., LTD., Tokyo (JP)

(72) Inventors: Akihiro Hirate, Takasaki (JP); Waichi Yamamura, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 18/004,342

(22) PCT Filed: Jun. 7, 2021

(86) PCT No.: PCT/JP2021/021580
§ 371 (c)(1),
(2) Date: Jan. 5, 2023

(87) PCT Pub. No.: WO2022/009580
PCT Pub. Date: Jan. 13, 2022

(65) Prior Publication Data
US 2023/0312351 A1    Oct. 5, 2023

(30) Foreign Application Priority Data
Jul. 7, 2020    (JP) .................. 2020-116853

(51) Int. Cl.
*C01B 32/00* (2017.01)
*C01B 32/914* (2017.01)
(Continued)

(52) U.S. Cl.
CPC .............. *C01B 32/21* (2017.08); *C23C 16/32* (2013.01); *C01P 2002/54* (2013.01)

(58) Field of Classification Search
CPC ...................................................... C23C 16/32
See application file for complete search history.

(56) References Cited

U.S. PATENT DOCUMENTS

| | | |
|---|---|---|
| 2012/0301723 A1 | 11/2012 | Kondo |
| 2019/0169768 A1 | 6/2019 | Mori et al. |

FOREIGN PATENT DOCUMENTS

| | | |
|---|---|---|
| JP | 4-13874 A | 1/1992 |
| JP | 2006-348388 A | 12/2006 |

(Continued)

OTHER PUBLICATIONS

International Search Report dated Aug. 10, 2021 in PCT/JP2021/021580, filed on Jun. 7, 2021, 2 pages.

*Primary Examiner* — Ian A Rummel
(74) *Attorney, Agent, or Firm* — Oblon, McClelland, Maier & Neustadt, L.L.P.

(57) ABSTRACT

A carbide-coated carbon material including a base material containing carbon as a main component and chlorine, and a carbide layer containing a carbide as a main component and chlorine, the carbide layer being disposed on the base material. The base material has, near an interface between the base material and the carbide layer, a base material buffer region where a chlorine concentration continuously changes in a direction toward the carbide layer. The carbide layer has, near the interface between the base material and the carbide layer, a carbide layer buffer region where the chlorine concentration continuously changes in a direction toward the base material. The carbide-coated carbon material has sufficient adhesion strength in the interface between the carbide layer and the base material containing carbon as a main component.

6 Claims, 9 Drawing Sheets

(51) Int. Cl.
*C23C 16/32* (2006.01)
*C01B 32/21* (2017.01)

(56) References Cited

FOREIGN PATENT DOCUMENTS

| | | | |
|---|---|---|---|
| JP | 2011-153378 A | 8/2011 | |
| JP | 2019-99453 A | 6/2019 | |
| JP | 2019-108611 A | 7/2019 | |

Concentration gradient of chlorine concentration at tantalum carbide layer buffer region near interface between base material and tantalum carbide layer (ppm/$\mu$m)

CARBIDE-COATED CARBON MATERIAL

CROSS-REFERENCE TO RELATED APPLICATIONS

The present application is a 35 U.S.C. § 371 National Stage Application of International Patent Application PCT/JP2021/021580, filed Jun. 7, 2021, which is based on and claims the benefit of priority to Japanese Application No. 2020-116853, filed Jul. 7, 2020. The entire contents of these applications are incorporated herein by reference.

TECHNICAL FIELD

The present invention relates to a carbide-coated carbon material in which a surface of a base material containing carbon as a main component is coated with a carbide layer.

BACKGROUND ART

Carbides such as tantalum carbide, niobium carbide, zirconium carbide, hafnium carbide, and tungsten carbide have a high melting point and excellent chemical stability, strength, toughness, and corrosion resistance. Therefore, a carbon base material can be coated with the carbide to improve properties such as heat resistance, chemical stability, strength, toughness, and corrosion resistance of the carbon base material. A carbide-coated carbon material in which a surface of a carbon base material is coated with a carbide film, especially a tantalum carbide-coated carbon material is used for a member of a device for producing a semiconductor single crystal such as silicon (Si), silicon carbide (SiC), and gallium nitride (GaN), or as a base for sintering that is used for sintering of a carbide tool. For example, by a gas phase reaction of a volatile metal chloride and a hydrocarbon, a base material is coated with a carbide (for example, see PTLs 1 and 2).

CITATION LIST

Patent Literature

PTL 1: JP2019-99453A
PTL 2: JP2019-108611A

SUMMARY OF INVENTION

Technical Problem

However, a carbide layer coating a surface of a base material containing carbon as a main component has a problem that the carbide layer is detached when the temperature of a carbide-coated carbon material is increased and decreased repeatedly. This problem is due to a different in thermal expansion coefficient between the carbide layer and the base material, and the like. It is an object of the present invention to provide a carbide-coated carbon material having sufficient adhesion strength in an interface between the carbide layer and the base material containing carbon as a main component.

Solution to Problem

The inventors of the present invention have intensively studied, and as a result, found that when chlorine is contained near the interface between the carbide layer and the base material at a predetermined concentration gradient and a concentration equal to or less than a predetermined concentration, the adhesion strength between the carbide layer and the base material can be enhanced. Thus, the present invention has been completed. The outline of the present invention is as follows:

[1] A carbide-coated carbon material including a base material containing carbon as a main component and chlorine, and a carbide layer containing a carbide as a main component and chlorine, the carbide layer being disposed on the base material, wherein the base material has, near an interface between the base material and the carbide layer, a base material buffer region where a chlorine concentration continuously changes in a direction toward the carbide layer, the carbide layer has, near the interface between the base material and the carbide layer, a carbide layer buffer region where the chlorine concentration continuously changes in a direction toward the base material, and the maximum values of chlorine concentrations at the base material buffer region and the carbide layer buffer region are 10,000 ppm or less.

[2] The carbide-coated carbon material according to [1], wherein the base material buffer region and the carbide layer buffer region are a first buffer region where the chlorine concentration continuously increases in a direction from the carbide layer to the base material or a second buffer region where the chlorine concentration continuously decreases in the direction from the carbide layer to the base material, respectively.

[3] The carbide-coated carbon material according to [1] or [2], wherein the chlorine concentrations at the base material buffer region and the carbide layer buffer region near the interface between the base material and the carbide layer are a local maximum value.

[4] The carbide-coated carbon material according to any one of [1] to [3], wherein the chlorine concentrations at the base material buffer region and the carbide layer buffer region each change within a range of 10 ppm or more and 5,000 ppm or less.

[5] The carbide-coated carbon material according to any one of [1] to [4], wherein a total thickness of the base material buffer region and the carbide layer buffer region is 200 μm or less.

[6] The carbide-coated carbon material according to any one of [1] to [5], wherein the carbide is tantalum carbide.

Advantageous Effects of Invention

The present invention can provide a carbide-coated carbon material having sufficient adhesion strength in an interface between the carbide layer and the base material containing carbon as a main component.

DESCRIPTION OF EMBODIMENTS

Hereinafter, a carbide-coated carbon material according to the present invention will be described with reference to tantalum carbide as a carbide.

[For Tantalum Carbide-Coated Carbon Material]

Figure 1:
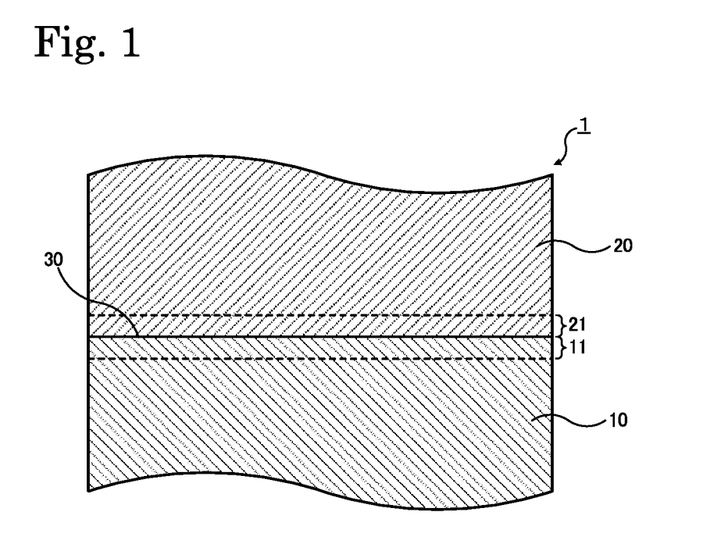
FIG. 1 is a schematic cross-sectional view illustrating a tantalum carbide-coated carbon material according to an embodiment.

Hereinafter, a tantalum carbide-coated carbon material according to an embodiment of the present invention will be described with reference to FIG. 1.

A tantalum carbide-coated carbon material 1 according to the embodiment of the present invention includes a base material 10 containing carbon as a main component and chlorine, and tantalum carbide layer 20 that is disposed on the base material 10 and contains tantalum carbide as a main component and chlorine. The base material 1 has, near an interface between the base material 10 and the tantalum carbide layer 20, a base material buffer region 11 where a chlorine concentration continuously changes in a direction toward the tantalum carbide layer 20. The tantalum carbide layer 20 has, near the interface between the base material 10 and the tantalum carbide layer 20, a tantalum carbide layer buffer region 21 where the chlorine concentration continuously changes in a direction toward the base material 10. The interface between the base material 10 and the tantalum carbide layer 20 is represented by a numeral 30. The interface 30 can enhance the adhesion strength between the base material 10 and the tantalum carbide layer 20. A portion or all of the base material 10 may be coated with the tantalum carbide layer 20. The chlorine concentration herein is based on mass.

Although the present invention is not limited to the following description, the following description is considered to be a reason that the adhesion strength between the base material 10 and the tantalum carbide layer 20 can be enhanced by chlorine contained near the interface between the base material 10 and the tantalum carbide layer 20. When the chlorine concentration near the interface between the base material 10 and the tantalum carbide layer 20 changes, the thermal expansion coefficient of the base material 10 at a region near the interface and the thermal expansion coefficient of the tantalum carbide layer 20 near the interface may change to decrease a difference in the thermal expansion coefficient near the interface between the base material 10 and the tantalum carbide layer 20. That is, the base material buffer region 11 and the tantalum carbide layer buffer region 21 may act as a buffer layer that relaxes the difference in the thermal expansion coefficient between the base material 10 and the tantalum carbide layer 20. Furthermore, the chlorine concentration continuously changes, and therefore the thermal expansion coefficient can be gradually changed. Thus, a stress generated by the difference in the thermal expansion coefficient due to different chlorine concentrations can be relaxed.

As the base material 10, for example, a base material for a carbon material such as isotropic graphite, extrusion graphite, thermal decomposition graphite, and carbon fiber reinforced carbon composite material (C/C composite) can be used. The shape and properties of the base material 10 are not particularly limited. The base material 10 can be processed in an optional shape for use according to applications and the like.

At the base material buffer region 11, the chlorine concentration continuously changes in the direction toward the tantalum carbide layer 20. In the tantalum carbide layer 20, the chlorine concentration continuously changes in the direction toward the base material 10. The phrase "continuously change" means that the chlorine concentration continuously changes in the direction from the tantalum carbide layer 20 to the base material 10 at a proportion of 1.0 ppm or more to a depth of 1 μm. Specifically, the phrase "continuously change" herein means that the chlorine concentration continuously changes and the concentration gradient of chlorine concentration is 1.0 ppm/μm or more or −1.0 ppm/μm or less. Therefore, a case where the chlorine concentration continuously changes and the concentration gradient of chlorine concentration is less than 1.0 ppm/μm and more than −1.0 ppm/μm does not correspond to the phrase "continuously change".

It is preferable that the base material buffer region 11 and the tantalum carbide layer buffer region 21 be a first buffer region where the chlorine concentration continuously increases in the direction from the tantalum carbide layer 20 to the base material 10 or a second buffer region where the chlorine concentration continuously decreases in the direction from the tantalum carbide layer 20 to the base material 10, respectively. In this case, the thermal expansion coefficients of the base material 10 and the tantalum carbide layer 20 can be gradually increased or decreased respectively. Therefore, the difference in thermal expansion coefficient between the base material 10 and the tantalum carbide layer 20 can be further decreased.

The whole of the tantalum carbide layer 20 may contain chlorine. In this case, the adhesion strength of the tantalum carbide layer 20 can also be enhanced. In this case, the whole tantalum carbide layer 20 is a tantalum carbide layer buffer region. However, chlorine may deteriorate properties, such as heat resistance, chemical stability, strength, toughness, and corrosion resistance, of the tantalum carbide layer. From such a viewpoint, it is preferable that the chlorine concentration of the base material 10 and/or the tantalum carbide layer 20 only near the interface between the base material 10 and the tantalum carbide layer 20 be high. From the viewpoint, the total thickness of the base material buffer region 11 and the tantalum carbide layer buffer region 21 is preferably 200 μm or less, more preferably 100 μm or less, and further preferably 50 μm or less. The thickness of each of the base material buffer region 11 and the tantalum carbide layer buffer region 21 is preferably 100 μm or less, more preferably 50 μm or less, and further preferably 30 μm or less.

As described above, chlorine can enhance the adhesion strength between the base material 10 and the tantalum carbide layer 20, but may deteriorate the properties of the tantalum carbide layer 20. From such a viewpoint, it is preferable that the chlorine concentrations of the base material buffer region 11 and the tantalum carbide layer buffer region 21 near the interface between the base material 10 and the tantalum carbide layer 20 be local maximum values.

The maximum values of chlorine concentrations at the base material buffer region 11 and the tantalum carbide layer buffer region 21 are 10,000 ppm or less. When the maximum values of chlorine concentrations at the base material buffer region 11 and the tantalum carbide layer buffer region 21 are more than 10,000 ppm, the chlorine concentrations at the base material buffer region 11 and the tantalum carbide layer buffer region 21 are too high, and the adhesion strength of the tantalum carbide layer 20 may be decreased. From such a viewpoint, the maximum values of chlorine concentrations at the base material buffer region 11 and the tantalum carbide layer buffer region 21 are preferably 8,000 ppm or less, more preferably 6,000 ppm or less, and further preferably 5,000 ppm or less.

It is preferable that the chlorine concentrations at the base material buffer region 11 and the tantalum carbide layer buffer region 21 each change within a range of 10 ppm or more and 5,000 ppm or less. When the chlorine concentrations are 10 ppm or more, the adhesion strength between the base material 10 and the tantalum carbide layer 20 can be further enhanced. In contrast, when the chlorine concentrations are 5,000 ppm or less, the chlorine concentrations are too high, and a decrease in adhesion strength can be suppressed. From the viewpoint, it is more preferable that the chlorine concentrations at the base material buffer region 11 and the tantalum carbide layer buffer region 21 each change within a range of 30 ppm or more and 3,500 ppm or less.

When the chlorine concentration at the tantalum carbide layer buffer region 21 continuously increases in the direction from the tantalum carbide layer 20 to the base material 10, the concentration gradient of chlorine concentration at the tantalum carbide layer buffer region 21 near the interface between the base material 10 and the tantalum carbide layer 20 is preferably 1.5 ppm/μm or more. When the concentration gradient of chlorine concentration is 1.5 ppm/μm or more and the tantalum carbide layer buffer region 21 is thin, the chlorine concentration near the interface between the base material 10 and the tantalum carbide layer 20 can be made high such that the difference in thermal expansion coefficient between the base material 10 and the tantalum carbide layer 20 can be sufficiently small. From such a viewpoint, the concentration gradient of chlorine concentration is more preferably 10 ppm/μm or more, further preferably 50 ppm/μm or more, yet further preferably 100 ppm/μm or more, and particularly preferably 200 ppm/μm or more.

The tantalum carbide layer 20 contains tantalum carbide as a main component and chlorine, and may contain a small amount of atom other than carbon, tantalum, and chlorine. Specifically, the tantalum carbide layer may contain 100 ppm or less of impurity element or doping element other than carbon, tantalum, and chlorine.

The tantalum carbide-coated carbon material according to the embodiment of the present invention can be produced by forming the tantalum carbide layer on a surface of the base material. The tantalum carbide layer can be formed on the surface of the base material, for example, by a method such as a chemical vapor deposition (CVD) method, a sintering method, and a carbonization method. In particular, the method for forming the tantalum carbide layer is preferably the CVD method since a uniform dense film can be formed.

The CVD method includes a thermal CVD method, an optical CVD method, a plasma CVD method, and the like. For example, the thermal CVD method can be used to form the tantalum carbide layer. The thermal CVD method has an advantage that an apparatus configuration is relatively simple, there is no damage due to plasma, and the like. For example, an external heating type reduced pressure CVD apparatus 51 shown in FIG. 2 can be used to form a tantalum carbide-coated film by the thermal CVD method. In the external heating type reduced pressure CVD apparatus 51, a carbon base material 54 is supported by a supporter 55 in a reaction chamber 52 including a heater 53, a raw material supply unit 56, an air exhaustion unit 57, and the like.

A method for producing the tantalum carbide-coated carbon material according to the embodiment of the present invention will be described with reference to FIGS. 2 and 3.

The carbon base material 54 is first placed in the reaction chamber 52 of the external heating type reduced pressure CVD apparatus 51 (Step S101). The carbon base material 54 is supported by the supporter 55 having three support units with a pointed tip end. The surface roughness Ra of the carbon base material 54 is preferably 1.0 to 10.0 μm.

Subsequently, the reaction chamber 52 is heated (Step S102). For example, the reaction chamber 52 is heated under conditions of an air pressure of 10 to 100 Pa and a temperature of 1,100° C.

Next, the base material buffer region is formed in the carbon base material 54 (Step S103). Chlorine (Cl) is diffused from a surface of the carbon base material 54 to form a region where the chlorine (Cl) concentration is high near the surface of the base material 54. Specifically, a chlorine gas (or a hydrogen chloride gas) and argon (Ar) as a carrier gas are supplied from the raw material supply unit 56 to the reaction chamber 52 in which the carbon base material 54 is placed and that is heated in the step S102. Meanwhile, the reaction chamber 52 is heated at a temperature of 1,100° C. also in the step S103.

The tantalum carbide layer is formed on the surface of the carbon base material 54 (Step S104). As raw material gases, a gas of a compound having a carbon atom such as a hydrocarbon having 1 to 3 carbon atoms and a tantalum halide gas such as tantalum tetrachloride ($TaCl_5$) are supplied from the raw material supply unit 56 to the reaction chamber 52. Examples of the hydrocarbon having 1 to 3 carbon atoms include an alkane such as methane ($CH_4$), ethane ($C_2H_6$), and propane ($C_3H_6$), an alkene such as ethylene ($C_2H_4$) and propylene ($C_3H_6$), and an alkyne such as acetylene ($C_2H_2$) and propyne ($C_3H_4$). Among the hydrocarbons, methane ($CH_4$), ethane ($C_2H_6$), propane ($C_3H_8$), ethylene ($C_2H_4$), and acetylene ($C_2H_2$) are preferred, and methane ($CH_4$), ethane ($C_2H_6$), and propane ($C_3H_6$) are more preferred. The tantalum halide gas can be generated, for example, by a method for vaporizing tantalum halide under heating, or a method for reacting tantalum metal with a halogen gas. The raw material gases supplied from the raw material supply unit 56 are then subjected to a thermal CVD reaction at a high temperature of 1,550° C. under a reduced pressure of 1 to 100 Pa to form the tantalum carbide layer on the carbon base material 54. At this time, chlorine that is introduced in the step S103 and is present at the base material buffer region of the carbon base material 54 is diffused to form the tantalum carbide layer buffer region at a region near the carbon base material in the tantalum carbide layer.

It is preferable that the step S104 be performed after the step S103 is performed. However, the steps S103 and S104 can be simultaneously performed. In this case, the whole tantalum carbide layer contains chlorine to form the tantalum carbide layer buffer region. Chlorine is diffused from the tantalum carbide layer to form the base material buffer region in the base material.

The tantalum carbide-coated carbon material according to the embodiment of the present invention is an example of carbide-coated carbon material of the present invention, and the carbide-coated carbon material of the present invention is not limited to the tantalum carbide-coated carbon material. A carbide of the carbide-coated carbon material of the present invention is not limited to tantalum carbide. Examples of the carbide of the carbide-coated carbon material of the present invention include tantalum carbide, niobium carbide, zirconia carbide, hafnium carbide, and tungsten carbide. One type of the carbide may be used alone or two or more types thereof may be used in combination. Among the carbides, tantalum carbide is preferred since tantalum carbide has the highest melting point, and excellent chemical stability, strength, and corrosion resistance.

EXAMPLES

Hereinafter, the present invention will be described more specifically with reference to Examples, but the present invention is not limited thereto.

Tantalum carbide-coated carbon materials in Examples 1 to 5 and Comparative Examples 1 to 3 were produced as follows.

Example 1

Figure 2:
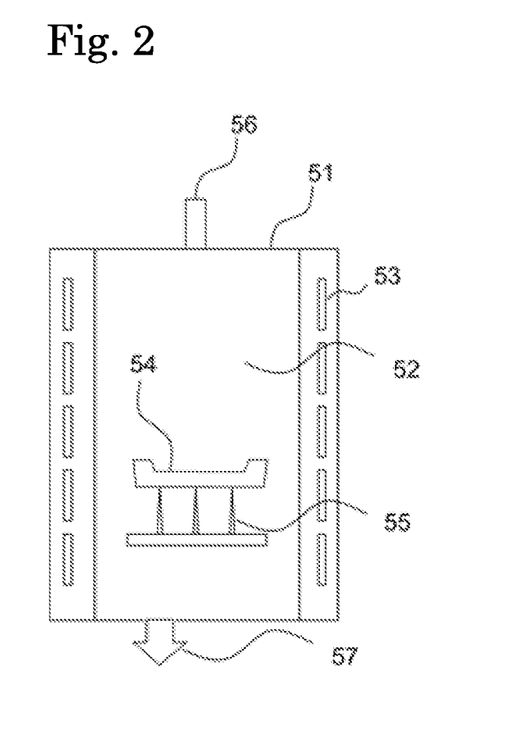
FIG. 2 is a schematic view of an external heating type reduced pressure CVD apparatus according to the embodiment.
Figure 3:
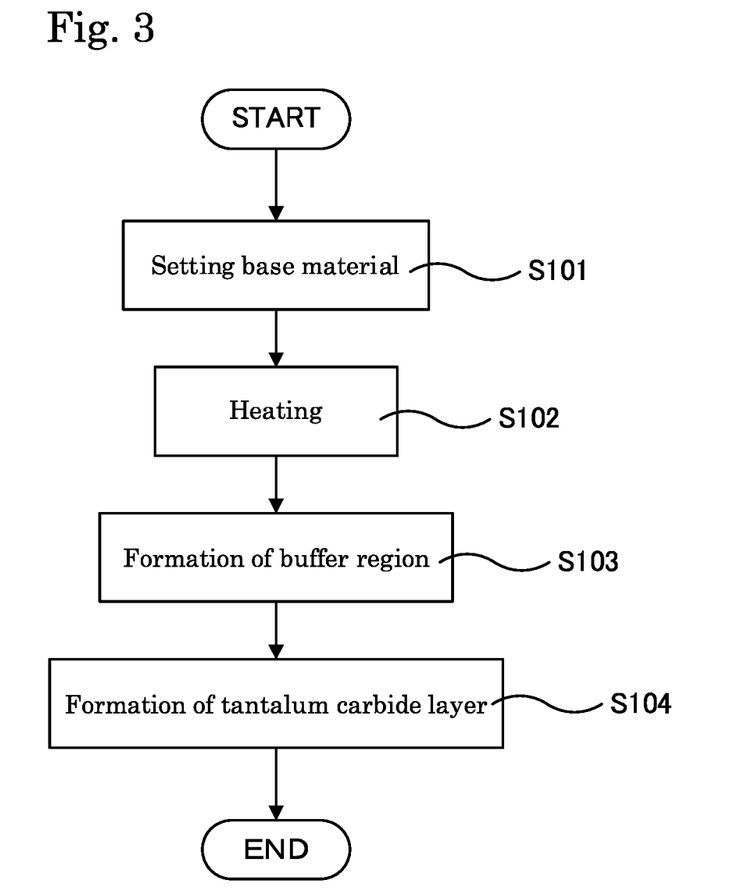
FIG. 3 is a flowchart illustrating a method for producing the tantalum carbide-coated carbon material according to the embodiment.
Figure 4:
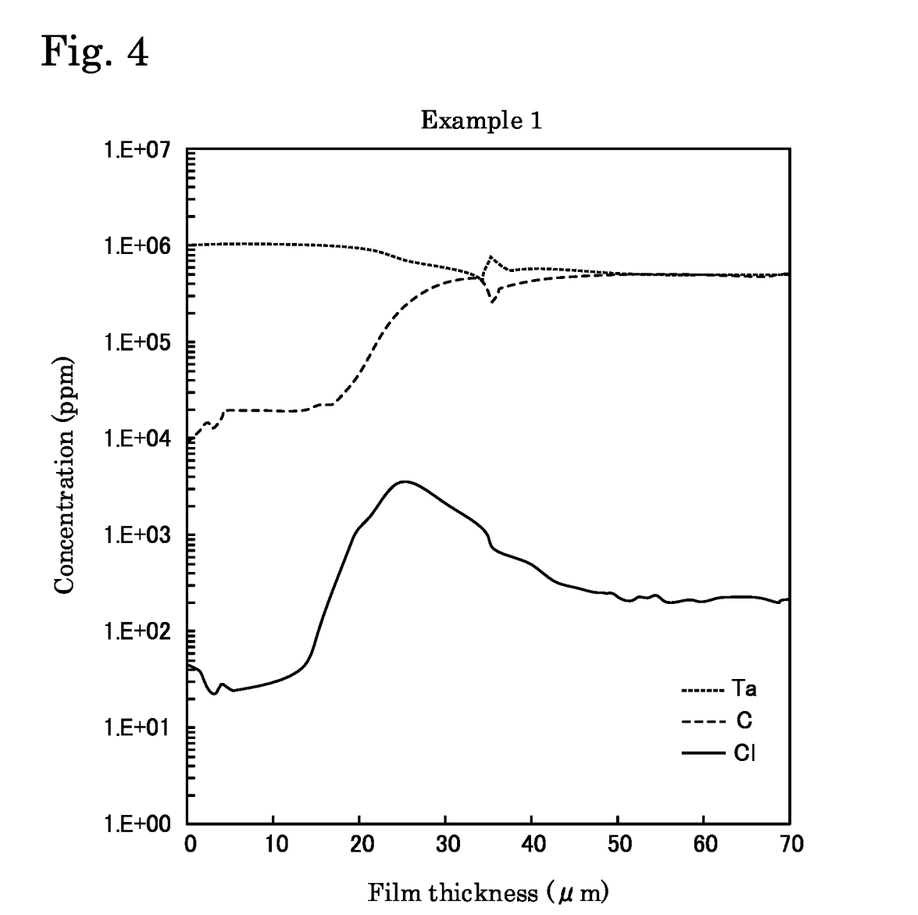
FIG. 4 shows results of GDMS analysis of a tantalum carbide-coated carbon material in Example 1.

The carbon base material 54 was first placed in the reaction chamber of the external heating type reduced pressure CVD apparatus 51 shown in FIG. 2 (Step S101). A disc member formed from isotropic graphite was used as the carbon base material 54. The carbon base material 54 was supported by the supporter 55 having three support units with a pointed tip end. The surface roughness Ra of the carbon base material 54 was 5.0 μm.

The reaction chamber 52 was then heated under conditions of an air pressure of 50 Pa and a temperature of 1,100° C. (Step S102). A chlorine gas and argon (Ar) as a carrier gas were supplied from the raw material supply unit 56 to the reaction chamber 52 toward the carbon base material 54 heated in the step S102 (Step S103). The gas flows of the chlorine gas and the argon gas were controlled to 0.25 SLM (Standard Liter/Minute) and 1.00 SLM, respectively, by a mass flow controller. The gas supply time was 30 minutes. The reaction chamber 52 was heated at a temperature of 1,100° C. also in the step S103.

After the reaction chamber 52 was heated at a temperature of 1,550° C., a $TaCl_5$ gas, a $CH_4$ gas, and an Ar gas were then mixed, and the obtained mixed gas was supplied to the reaction chamber 52 to form a tantalum carbide layer on the surface of the carbon base material 54 (Step S104). Thus, the tantalum carbide-coated carbon material in Example 1 was produced. The film formation time of the tantalum carbide layer was three hours. The gas flows of the $TaCl_5$ gas, the $CH_4$ gas, and the carrier gas (Ar) were controlled to 0.125 SLM, 0.25 SLM, and 1.00 SLM, respectively, by a mass flow controller. The molar ratio of the $TaCl_5$ gas, the $CH_4$ gas, and the carrier gas (Ar) was 1:2:8. The thickness of the tantalum carbide layer was 24 μm. In the step S104, chlorine was diffused from the carbon base material 54 to form a tantalum carbide layer buffer region in the tantalum carbide layer.

Example 2

The tantalum carbide-coated carbon material in Example 2 was produced in the same manner as in Example 1 except that, in the step S103, the gas supply time of the chlorine gas and the argon gas was changed from 30 minutes to 15 minutes.

Example 3

The tantalum carbide-coated carbon material in Example 3 was produced in the same manner as in Example 1 except that, in the step S102, the heating temperature was changed from 1,100° C. to 1,550° C., the steps S103 and S104 were simultaneously performed, and in the step S103, the gas supply time of the chlorine gas and the argon gas was changed from 30 minutes to 180 minutes (three hours), and the flow rate of the chlorine gas was changed from 0.25 SLM to 0.01 SLM.

Example 4

The tantalum carbide-coated carbon material in Example 4 was produced in the same manner as in Example 1 except, in the step S104, that the gas of the compound containing carbon (C-based gas) in the mixed gas supplied to the reaction chamber 52 was changed from the $CH_4$ gas to a $C_2H_6$ gas and the flow rate of the C-based gas was changed from 0.25 SLM to 0.125 SLM.

Example 5

The tantalum carbide-coated carbon material in Example 5 was produced in the same manner as in Example 1 except that, in the step S104, the C-based gas in the mixed gas supplied to the reaction chamber 52 was changed from the $CH_4$ gas to a $C_3H_8$ gas and the flow rate of the C-based gas was changed from 0.25 SLM to 0.083 SLM.

Comparative Example 1

The tantalum carbide-coated carbon material in Comparative Example 1 was produced in the same manner as in Example 1 except that, in the step S103, the gas supply time of the chlorine gas and the argon gas was changed from 30 minutes to 60 minutes.

Comparative Example 2

The tantalum carbide-coated carbon material in Comparative Example 2 was produced in the same manner as in Example 1 except that the step S103 was not performed.

Comparative Example 3

In Comparative Example 3, a paste of tantalum carbide was applied to a carbon base material, the applied tantalum carbide was heated at a temperature of 2,000° C. for three hours resulting in sintering, to produce the tantalum carbide-coated carbon material in Comparative Example 3.

The production conditions of the tantalum carbide-coated carbon materials in Examples 1 to 5 and Comparative Examples 1 to 3 are shown in Table 1.

TABLE 1

| | Method for raw material supplying | Step S102 Heating temperature (° C.) | Step S103 Chlorine gas flow rate (SLM) | Step S103 Chlorine gas supply time (min) | Step S104 TaCl$_5$ gas flow rate (SLM) | Step S104 C-based gas flow rate (SLM) | Step S104 Ar gas flow rate (SLM) | Step S104 Film formation temperature of tantalum carbide layer (° C.) | Step S104 Film formation time of tantalum carbide layer (H) |
|---|---|---|---|---|---|---|---|---|---|
| Example 1 | Raw material gas | 1,100 | 0.25 | 30 | 0.125 | 0.25 | 1.00 | 1,550 | 3 |
| Example 2 | Raw material gas | 1,100 | 0.25 | 15 | 0.125 | 0.25 | 1.00 | 1,550 | 3 |
| Example 3 * | Raw material gas | 1,100 | 0.01 | 180 | 0.125 | 0.25 | 1.00 | 1,550 | 3 |
| Example 4 | Raw material gas | 1,100 | 0.25 | 30 | 0.125 | 0.125 | 1.00 | 1,550 | 3 |
| Example 5 | Raw material gas | 1,100 | 0.25 | 30 | 0.125 | 0.083 | 1.00 | 1,550 | 3 |
| Comparative Example 1 | Raw material gas | 1,550 | 0.25 | 60 | 0.125 | 0.25 | 1.00 | 1,550 | 3 |
| Comparative Example 2 | Raw material gas | — | — | — | 0.125 | 0.25 | 1.00 | 1,550 | 3 |
| Comparative Example 3 | Paste | — | — | — | — | — | — | 2,000 | 3 |

* In Example 3, the steps S103 and S104 were simultaneously performed.

The tantalum carbide-coated carbon materials in Examples 1 to 5 and Comparative Examples 1 to 3 produced as described above were evaluated as follows.

(1) Adhesion Strength of Tantalum Carbide Layer

The adhesion strength of a tantalum carbide layer was measured by a thin-film adhesion strength measurement device (trade name "ROMULUS IV" manufactured by PHOTOTECHNICA Corporation).

(2) Measurement of Chlorine Concentration and Concentration Gradient

The chlorine concentration in a depth direction from a surface of the tantalum carbide layer to a carbon base material and the concentration gradient of the chlorine concentration were measured by glow discharge mass spectrometry (GDMS).

The evaluation results of the tantalum carbide-coated carbon materials in Examples 1 to 5 and Comparative Examples 1 to 3 are shown in Table 2 and FIGS. 4 to 10.

(Description of GDMS Analysis)

For the tantalum carbide-coated carbon material in Example 1 (FIG. 4), the tantalum carbide layer buffer region ranges from a film thickness of 13 μm in which the chlorine concentration starts to increase to the interface between the tantalum carbide layer and the carbon base material (a film thickness of 25 μm), and the base material buffer region ranges from the interface between the tantalum carbide layer and the carbon base material to a film thickness of 50 μm in which a decrease in gradient of chlorine concentration is stopped.

For the tantalum carbide-coated carbon material in Example 2 (FIG. 5), the tantalum carbide layer buffer region ranges from a film thickness of 8 μm in which the chlorine concentration starts to increase to the interface between the tantalum carbide layer and the carbon base material (a film thickness of 20 μm), and the base material buffer region ranges from the interface between the tantalum carbide layer

TABLE 2

| | Maximum value (ppm) of chlorine concentration at buffer region | Minimum value (ppm) of chlorine concentration at buffer region | Concentration gradient (ppm/μm) of chlorine concentration at tantalum carbide layer buffer region near interface between base material and tantalum carbide layer | Concentration gradient (ppm/μm) of chlorine concentration at base material buffer region near interface between base material and tantalum carbide layer | Adhesion strength (MPa) |
|---|---|---|---|---|---|
| Example 1 | 3,300 | 33 | 270 | −166 | 30.5 |
| Example 2 | 1,600 | 35 | 263 | −76 | 27.1 |
| Example 3 | 73 | 40 | 1.5 | 2.0 | 24.5 |
| Example 4 | 3,500 | 36 | 240 | −155 | 35.1 |
| Example 5 | 3,600 | 38 | 252 | −154.0 | 37.2 |
| Comparative Example 1 | 15,000 | 2,200 | −1,350 | −520 | 5.2 |
| Comparative Example 2 | 3.2 | 1.9 | 0.16*1 | −0.03*2 | 3.5 |
| Comparative Example 3 | 1.2 | 0.28 | −3.6E−06 *1 | −2.3E−06 *2 | 8.5 |

Figure 5:
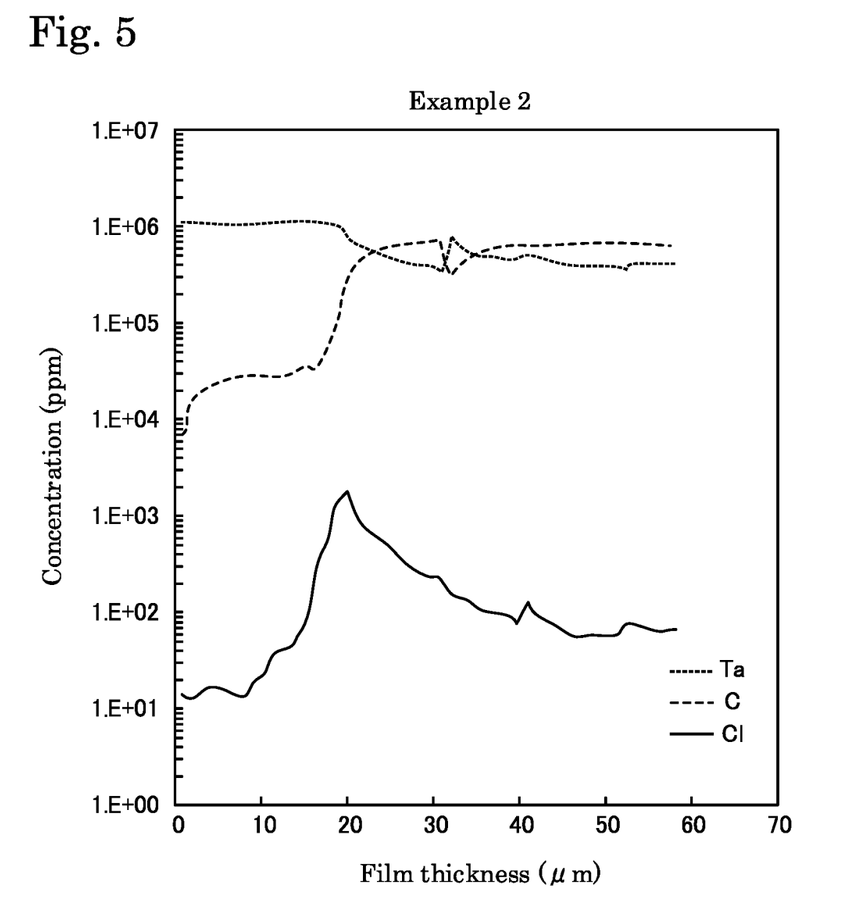
FIG. 5 shows results of GDMS analysis of a tantalum carbide-coated carbon material in Example 2.
Figure 6:
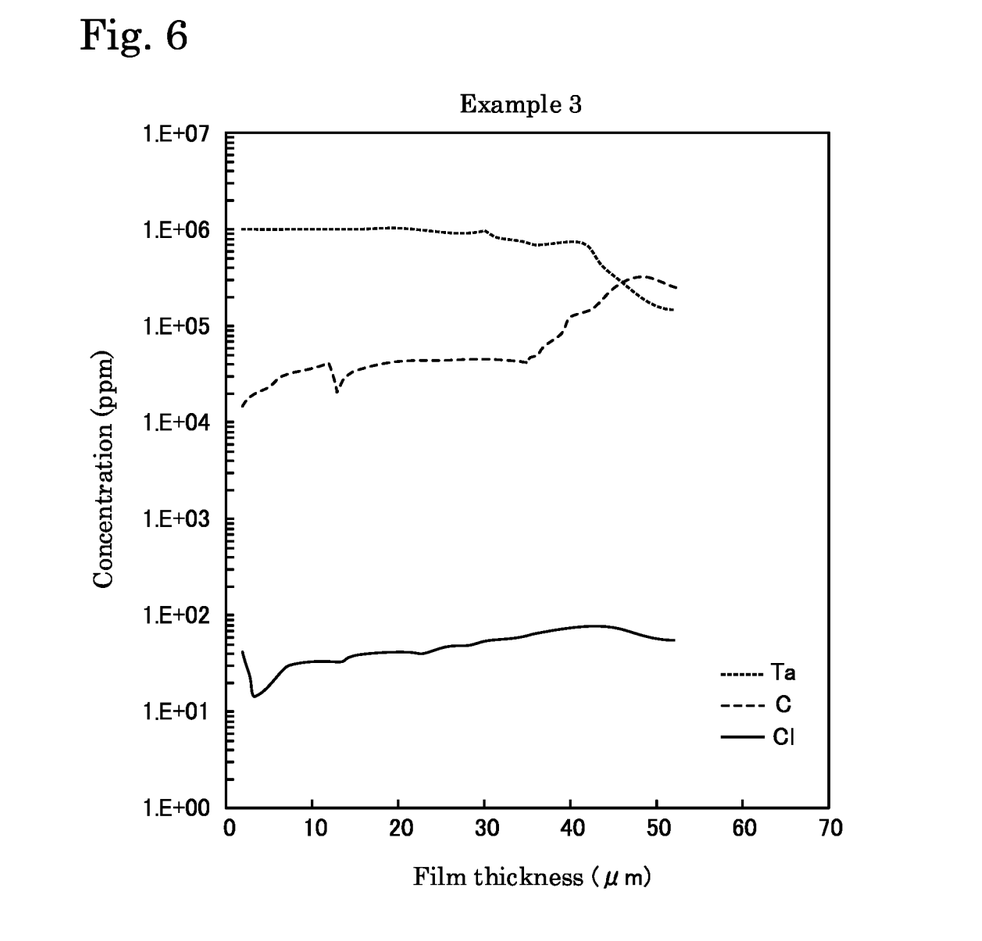
FIG. 6 shows results of GDMS analysis of a tantalum carbide-coated carbon material in Example 3.
Figure 7:
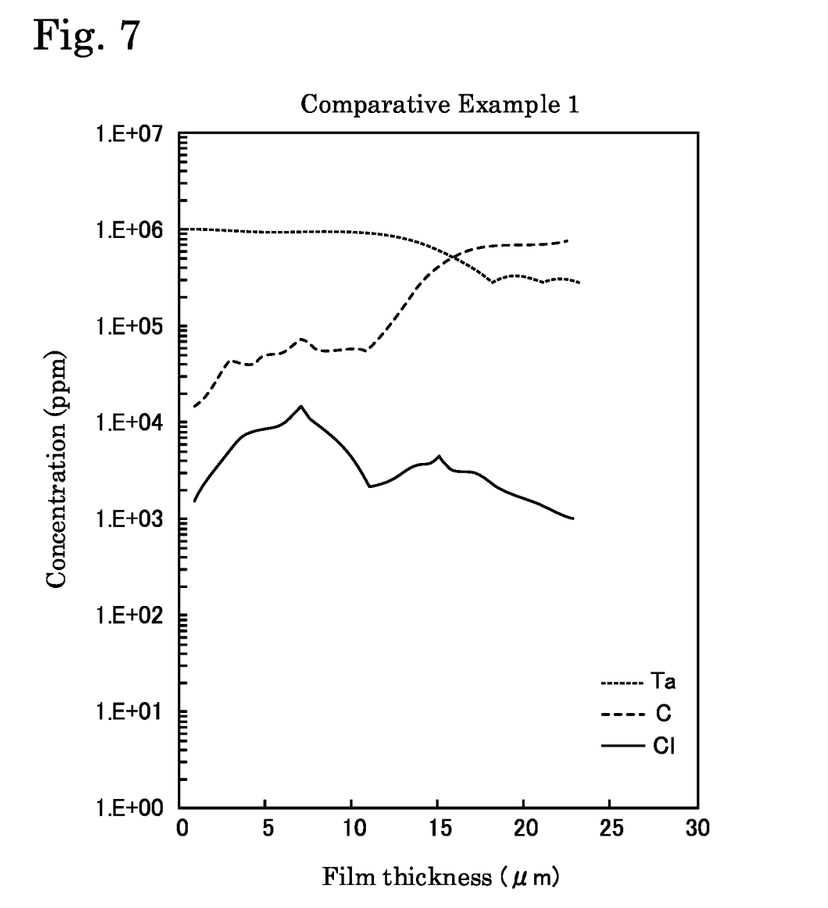
FIG. 7 shows results of GDMS analysis of a tantalum carbide-coated carbon material in Comparative Example 1.
Figure 8:
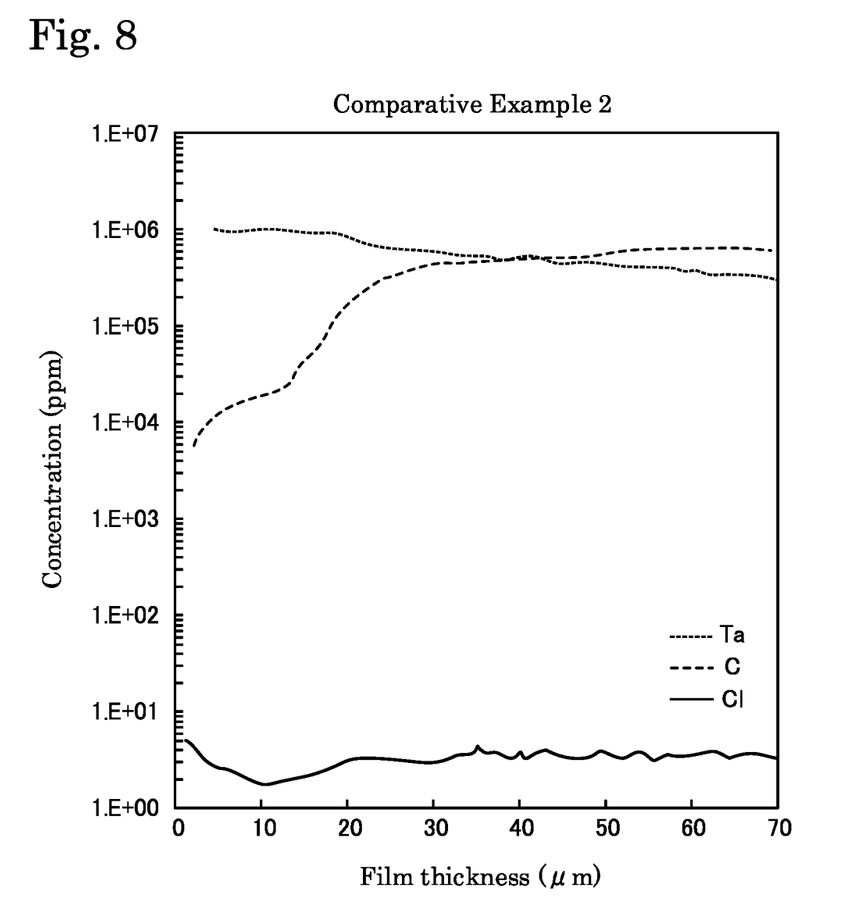
FIG. 8 shows results of GDMS analysis of a tantalum carbide-coated carbon material in Comparative Example 2.
Figure 9:
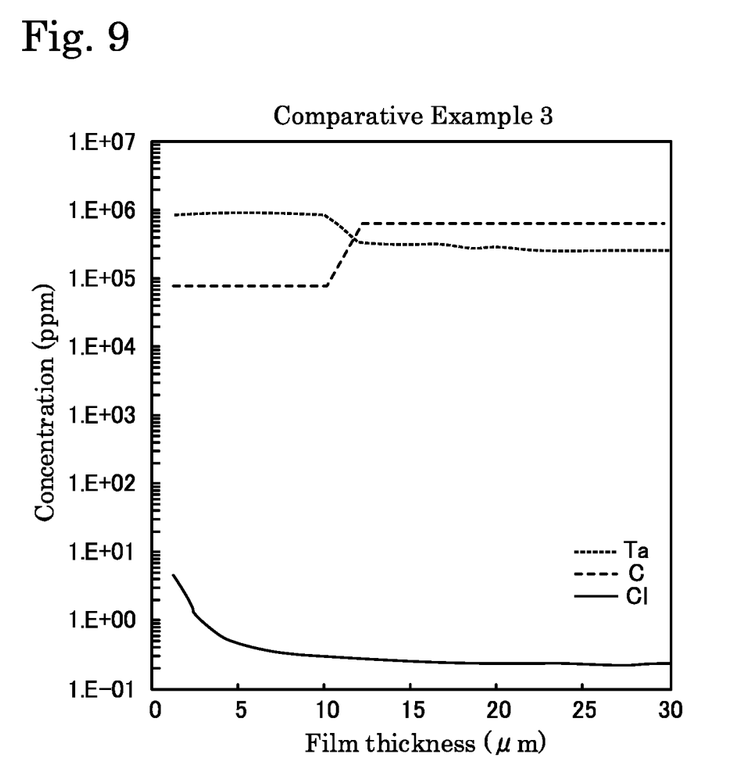
FIG. 9 shows results of GDMS analysis of a tantalum carbide-coated carbon material in Comparative Example 3.
Figure 10:
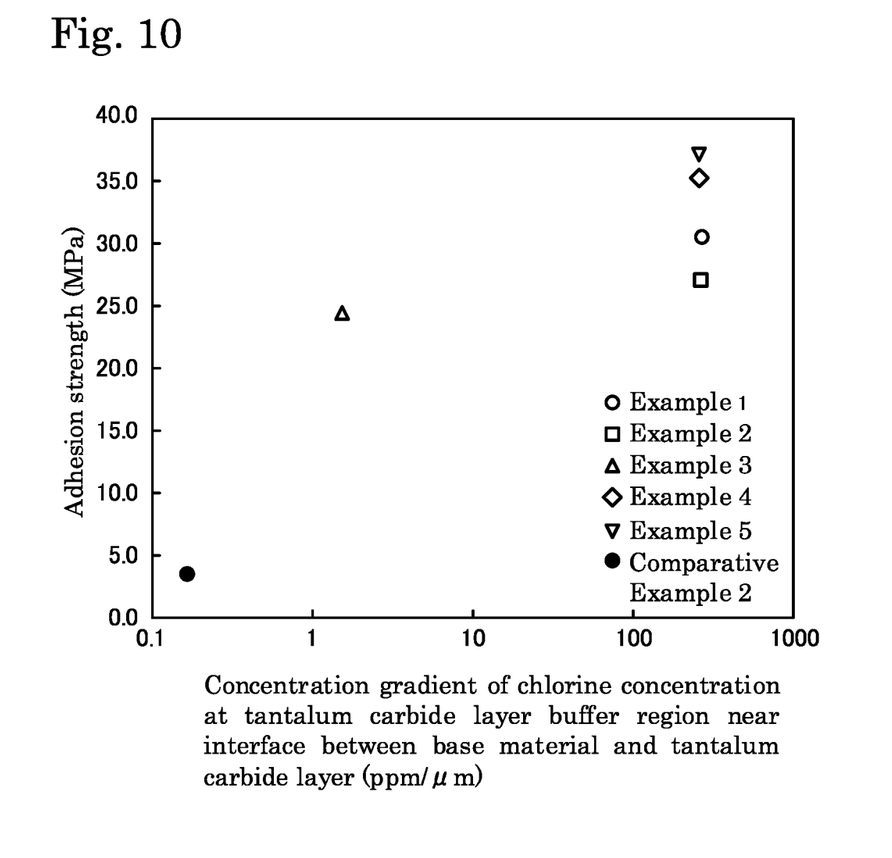
FIG. 10 is a graph showing a correlation between the chlorine concentration gradient and the adhesion strength of the tantalum carbide-coated carbon materials in Examples 1 to 5 and Comparative Example 2 according to the embodiment.

*1 Concentration gradient of chlorine concentration at tantalum carbide layer near interface (without tantalum carbide layer buffer region)
*2 Concentration gradient of chlorine concentration at base material near interface (without base material buffer region)

and the carbon base material to a film thickness of 45 μm in which a decrease in gradient of chlorine concentration is stopped.

For the tantalum carbide-coated carbon material in Example 3 (FIG. 6), the tantalum carbide layer (the tantalum carbide layer buffer region) ranges from a film thickness of 3 μm in which the chlorine concentration starts to increase to the interface between the tantalum carbide layer and the carbon base material (a film thickness of 45 μm), and the base material buffer region ranges from the interface between the tantalum carbide layer and the carbon base material to a film thickness of 50 μm in which a decrease in gradient of chlorine concentration is stopped.

For the tantalum carbide-coated carbon materials in Examples 4 and 5, the description of results of GDMS analysis using the drawings is omitted.

For the tantalum carbide-coated carbon material in Comparative Example 1 (FIG. 7), the tantalum carbide layer buffer region ranges from a film thickness of 1 μm in which the chlorine concentration starts to increase to the interface between the tantalum carbide layer and the carbon base material (a film thickness of 17 μm), and the base material buffer region ranges from the interface between the tantalum carbide layer and the carbon base material to a position (a film thickness of 22 μm) where a decrease in gradient of chlorine concentration is stopped.

For the tantalum carbide-coated carbon material in Comparative Example 2 (FIG. 8), the tantalum carbide layer occupies the tantalum carbide-coated carbon material to a film thickness of 20 μm, and the carbon base material occupies a film thickness of more than 20 μm.

For the tantalum carbide-coated carbon material in Comparative Example 3 (FIG. 9), the tantalum carbide layer occupies the tantalum carbide-coated carbon material to a film thickness of 10 μm, and the carbon base material occupies a film thickness of more than 10 μm.

(Evaluation Results)

For each of the tantalum carbide-coated carbon materials in Examples 1 to 5, the base material had, near the interface between the base material and the tantalum carbide layer, the base material buffer region where the chlorine concentration continuously changed in the direction toward the carbide layer, the tantalum carbide layer had, near the interface between the base material and the carbide layer, the carbide layer buffer region where the chlorine concentration continuously changed in the direction toward the base material, and the maximum values of chlorine concentrations at the base material buffer region and the carbide layer buffer region were 10,000 ppm or less. Therefore, the adhesion strength of the tantalum carbide layer was high.

As seen from comparison between the tantalum carbide-coated carbon material in Example 2 and the tantalum carbide-coated carbon material in Example 3, it is preferable that the step S104 be performed after the step S103, but simultaneous implementation of the steps S103 and S104 can also achieve high adhesion strength.

In contrast, the maximum values of chlorine concentrations at the base material buffer region and the carbide layer buffer region in the tantalum carbide-coated carbon material in Comparative Example 1 were more than 10,000 ppm, and therefore the adhesion strength of the tantalum carbide layer was low.

For each of the tantalum carbide-coated carbon materials in Comparative Examples 2 and 3, the base material did not have, near the interface between the base material and the tantalum carbide layer, the base material buffer region where the chlorine concentration continuously changed in the direction toward the carbide layer, and the tantalum carbide layer did not have, near the interface between the base material and the carbide layer, the carbide layer buffer region where the chlorine concentration continuously changed in the direction toward the base material. Therefore, the adhesion strength of the tantalum carbide layer was low. As described above, the phrase "continuously change" herein means that the chlorine concentration continuously changes and the concentration gradient of chlorine concentration is 1 ppm/μm or more or −1 ppm/μm or less.

REFERENCE SIGNS LIST

1 Tantalum carbide-coated carbon material
10 Base material
11 Base material buffer region
20 Tantalum carbide layer
21 Tantalum carbide layer buffer region
30 Interface between base material and tantalum carbide layer
51 External heating type reduced pressure CVD apparatus
52 Reaction chamber
53 Heater
54 Carbon base material
55 Supporter
56 Raw material supply unit
57 Air exhaustion unit

The invention claimed is:

1. A carbide-coated carbon material comprising:
a base material containing carbon as a main component and chlorine; and
a carbide layer containing a carbide as a main component and chlorine, the carbide layer being disposed on the base material, wherein
the base material has, near an interface between the base material and the carbide layer, a base material buffer region where a chlorine concentration continuously changes in a direction toward the carbide layer,
the carbide layer has, near the interface between the base material and the carbide layer, a carbide layer buffer region where the chlorine concentration continuously changes in a direction toward the base material, and
the maximum values of chlorine concentrations at the base material buffer region and the carbide layer buffer region are 10,000 ppm or less.

2. The carbide-coated carbon material according to claim 1, wherein
the base material buffer region and the carbide layer buffer region are a first buffer region where the chlorine concentration continuously increases in a direction from the carbide layer to the base material or a second buffer region where the chlorine concentration continuously decreases in the direction from the carbide layer to the base material, respectively.

3. The carbide-coated carbon material according to claim 1, wherein
the chlorine concentrations at the base material buffer region and the carbide layer buffer region near the interface between the base material and the carbide layer are a local maximum value.

4. The carbide-coated carbon material according to claim 1, wherein
the chlorine concentrations at the base material buffer region and the carbide layer buffer region each change within a range of 10 ppm or more and 5,000 ppm or less.

5. The carbide-coated carbon material according to claim 1, wherein
a total thickness of the base material buffer region and the carbide layer buffer region is 200 μm or less.

6. The carbide-coated carbon material according to claim 1, wherein the carbide is tantalum carbide.

* * * * *